US 6,740,965 B2

(12) United States Patent
Hsu et al.

(10) Patent No.: US 6,740,965 B2
(45) Date of Patent: May 25, 2004

(54) FLIP-CHIP PACKAGE SUBSTRATE

(75) Inventors: Chi-Hsing Hsu, Taipei Hsien (TW); Jimmy Hsu, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 0 days.

(21) Appl. No.: 10/064,061

(22) Filed: Jun. 6, 2002

(65) Prior Publication Data

US 2003/0201122 A1 Oct. 30, 2003

(30) Foreign Application Priority Data

Apr. 30, 2002 (TW) ........................................ 91206012 U

(51) Int. Cl.[7] ........................... H01L 23/48; H01L 23/52
(52) U.S. Cl. ....................................... 257/692; 257/778
(58) Field of Search ................................. 257/690–700

(56) References Cited

U.S. PATENT DOCUMENTS 6,225,702 B1 * 5/2001 Nakamura ................. 257/786
6,384,476 B2 * 5/2002 Takeuchi ................... 257/691
6,388,207 B1 * 5/2002 Figueroa et al. ........... 174/262
6,479,758 B1 * 11/2002 Arima et al. ............... 174/260

* cited by examiner

*Primary Examiner*—Kamand Cuneo
*Assistant Examiner*—Jeremy Norris
(74) *Attorney, Agent, or Firm*—Jianq Chyun IP Office

(57) ABSTRACT

A flip-chip package substrate comprising a plurality of wiring layers, at least one insulation layers and at least one conductive plugs. The wiring layers are sequentially stacked such that an insulation layer is always sandwiched between two neighboring wiring layers. The conductive plug passes through the insulation layer for connecting with wiring layers. The uppermost wiring layer has a plurality of bump pads while the bottommost wiring layer has a plurality of ball pads. The bump pads on the uppermost wiring layer are organized into bump pad rings. Similarly, the ball pads on the bottommost wiring layer are organized into ball pad rings. Relative position of both the bump pad rings and the ball pad rings are organized according to functions in sequential order so that the wiring distance from the bump pads down to the ball pads is optimized.

13 Claims, 9 Drawing Sheets

FLIP-CHIP PACKAGE SUBSTRATE

CROSS REFERENCE TO RELATED APPLICATIONS

This application claims the priority benefit of Taiwan application serial no. 91206012, filed Apr. 30, 2002.

BACKGROUND OF INVENTION

1. Field of Invention

The present invention relates to a flip-chip package substrate. More particularly, the present invention relates to a flip-chip package substrate having a lower plane inductance and synchronous switching noise (SSN).

2. Description of Related Art

Flip-chip (FC) bonding is a common type of packaging technique in a chip scale package (CSP). To form a flip-chip package, an array of die pads is formed on the active surface of a die. A bump is formed over each die pad. Finally, the die is flipped over so that the bumps can be attached to corresponding contacts, also known as bump pads, on a carrier. Since a flip-chip package occupies a small area and reduces signal transmission paths, flip-chip bonding technique has been widely adopted to produce various types of chip packages.

FIG. 1 is a schematic cross-sectional view of a conventional flip-chip package. As shown in FIG. 1, the flip-chip package includes a flip-chip package substrate 20 and a die 10. The flip-chip package substrate 20 consists of alternately stacked wiring layers 26 and insulation layers 28. A plurality of conductive plugs 30 that passes through the insulation layer 28 is used for connecting the wiring layers 26 electrically. In addition, the uppermost surface 22 of the flip-chip package substrate 20 has a plurality of bump pads 34 for connecting with bumps 16 on the die 10. The bump pads 34 are attached to the uppermost wiring layer 26 (the wiring layer closest to the upper surface 22). On the other hand, the bumps 16 are attached to the upper surface of the die pads 14 on the active surface 12 of the die 10. Furthermore, the bump pads 34 on the upper surface 22 of the flip-chip package substrate 20 are wired to the ball pads 36 on the bottom surface 24 through multiples of wiring layers 26 and conductive plugs 30. The ball pads 36 are attached to the lowest wiring layer (closest to the bottom surface 24). A conductive structure such as a solder ball may also be attached to each ball pad 36 so that the package is electrically connected to the next level of electronic device. Hence, the die 10 is able to transmit signals to external electronic devices through the flip-chip package substrate 20.

FIG. 2A is a top view of the die in FIG. 1. The active surface 102 of the die 100 in FIG. 2A has a plurality of die pads 106 (the die pads 14 in FIG. 1). According to signaling function (including signal, power, ground and core power/ground) in the die 100, die pads 106 may be classified into signal pads 106a, power pads 106b, ground pads 106c and core pads 108. In general, the signal pads 106a, the power pads 106b and the ground pads 106c are distributed outside and around the cored pad region 110 while the core pads 108 are positioned within the core pad region 110. To collect die pads having identical function in one place, the signal pads 106a are enclosed within one or more signal pad rings 112a. Similarly, the power pads 106b are enclosed within one or more power pad rings 112b and the ground pads 106c are enclosed within one or more ground pad rings 112c. The signal pad rings, the power pad rings 112b and the ground pad rings 112c are all concentrically laid around the core region 110 on the active surface 102 of the die 100. Meanwhile, all the core pads 108 are positioned inside the central core region 110.

FIG. 3A is a top view of the central portion of the die in FIG. 1 showing a distribution of core power pads and core ground pads. As shown in FIG. 3A, the core pads 108 are divided into core power pads 108a and core ground pads 108b. The core power pads 108a and the core ground pads 108b form an alternately positioned array. FIG. 3B is a top view of the central portion of the die in FIG. 1 showing an alternative distribution of core power pads and core ground pads. In FIG. 3B, the core power pads 108a are grouped together to form at least a core power pad ring 114a and core ground pads 108b are similarly grouped together to form at least a core ground pad ring 114b. Both the core power pad ring 114a and the core ground pad ring 114b are concentric to the central region of the die.

FIG. 2B is a top view of a flip-chip package substrate within the package shown in FIG. 1. The ball pads 136 of a conventional flip-chip package substrate 130 correspond to the signal pads 106a, the power pads 106b, the ground pads 106c and the core power/ground pads 108 in FIG. 2A. In other words, the ball pads 136 may be classified into signal ball pads 136a, power ball pads 136b, ground ball pads 136c and core ball pads 138. The core ball pads 138 lies within the core region 140. However, the signal ball pads 136a, the power ball pads 136b and the ground ball pads 136c are randomly distributed on the bottom surface 134 of the flip-chip package substrate 130. Hence, there is a mismatch between the ball pads on the substrate 130 and the signal pads 106a, the power pads 106b and the ground pads 106c on the die 100 shown in FIG. 2A. Ultimately, overall length of wires linking the die pads 106 to the ball pads 136 is increased leading to a longer current path and a greater plane inductance.

SUMMARY OF INVENTION

Accordingly, one object of the present invention is to provide a flip-chip package substrate having ball pads arranged to match the die pads on a die having a multiple pad ring"s structure. Ultimately, overall wiring length from the die pads on the die to the ball pads on the substrate, plane inductance and synchronous switching noise of the package are all reduced while electrical performance of the package is improved.

To achieve these and other advantages and in accordance with the purpose of the invention, as embodied and broadly described herein, the invention provides a flip-chip package substrate. The flip-chip package substrate is a stack structure comprising a plurality of wiring layers such that neighboring wiring layers are separated from each other by an insulation layer. The substrate also includes one or more conductive plugs that pass through the insulation layer for electrically connecting wiring layers. The uppermost wiring layer has a plurality of core bump pads, a plurality of signal bump pads, a plurality of power bump pads and a plurality of ground bump pads. The signal bump pads, the power bump pads and the ground bump pads are grouped together to form one or more signal bump pad rings, one or more power bump pad rings and one or more ground bump pad rings. The signal bump pad rings, the power bump pad rings and the ground bump pad rings are distributed concentrically around the central region of the substrate. In addition, the bottommost wiring layer has a plurality of core ball pads, a plurality of signal ball pads, a plurality of power ball pads and a plurality of ground ball pads. The signal ball pads, the power ball pads and the ground ball pads are grouped together to form one or more signal ball pad rings, one or more power ball pad rings and one or more ground ball pad rings. The signal ball pad rings, the power ball pad rings and the ground ball pad rings are concentrically distributed around the central region of the substrate.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
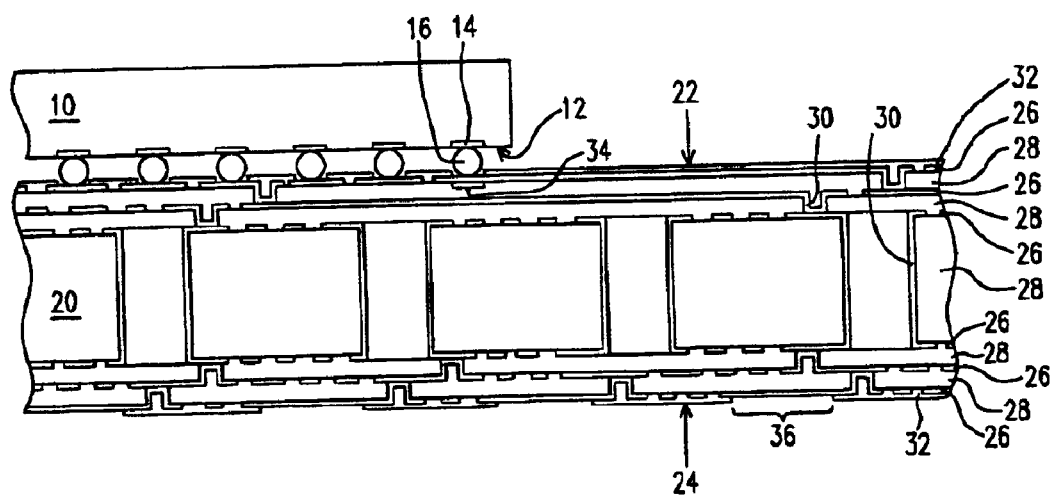
FIG. 1 is a schematic cross-sectional view of a conventional flip-chip package.

Reference will now be made in detail to the present preferred embodiments of the invention, examples of which are illustrated in the accompanying drawings. Wherever possible, the same reference numbers are used in the drawings and the description to refer to the same or like parts.

Figure 4:
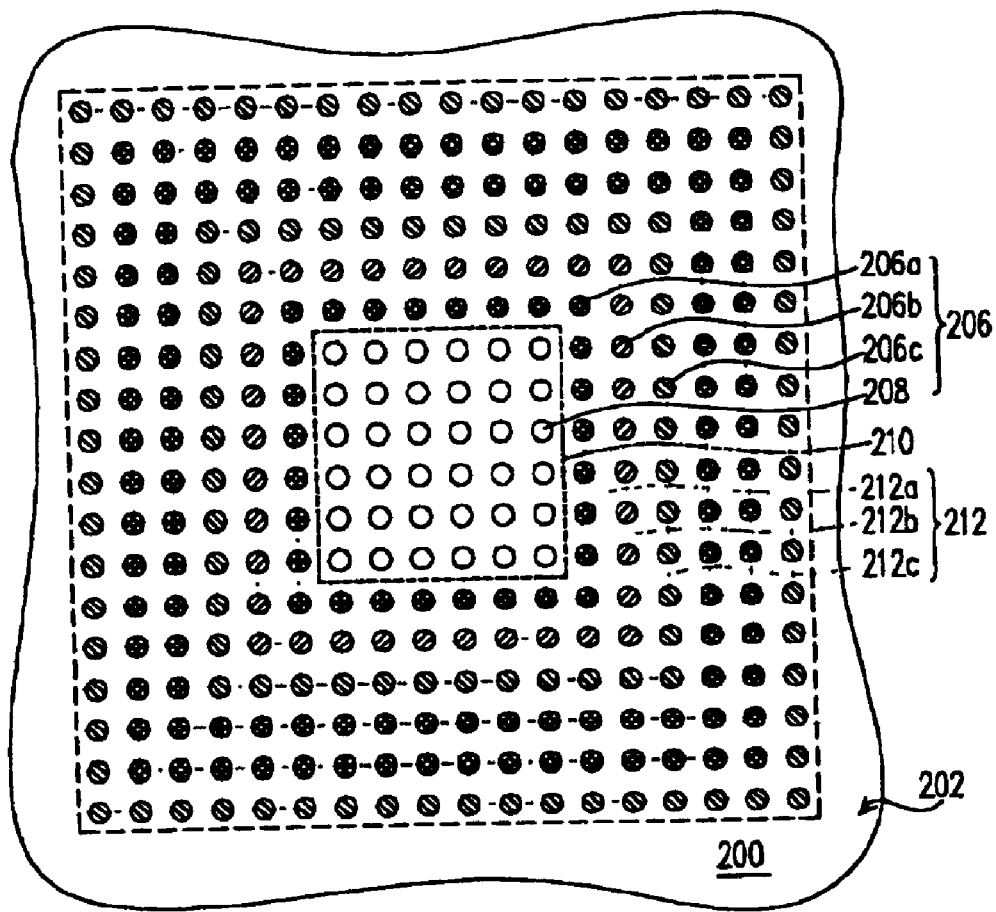
FIG. 4 is a top view showing a portion of a flip-chip package substrate fabricated according to one preferred embodiment of this invention.

FIG. 4 is a top view showing a portion of a flip-chip package substrate fabricated according to one preferred embodiment of this invention. The flip-chip package substrate 200 in FIG. 4 and the flip-chip package substrate 20 in FIG. 1 are structurally identical. The flip-chip package substrate 200 similarly includes a plurality of wiring layers 26, at least one insulation layer 28 and a plurality of conductive plugs 30. The wiring layers 26 and the insulation layers 28 together form a stack structure having an insulation layer sandwiched between two neighboring wiring layers 26 and vice versa. The conductive plugs 30 passes through the insulation layer 28 for electrically connecting two wiring layers 26. In addition, the upper surface 22 and the bottom surface 24 of the flip-chip package substrate 200 both have a solder mask 32. The solder mask 32 protects the outermost wiring layer 26 and underlying insulation layer 28 and exposes a set of bump pads 34 and a set of ball pads 36 respectively. The bump pads 34 are attached to the uppermost wiring layer 26 (closest to the upper surface 22 of FIG. 1). On the other hand, the ball pads 36 are attached to the bottommost wiring layer 26 (closest to the bottom surface 24 of FIG. 1).

Figure 2A:
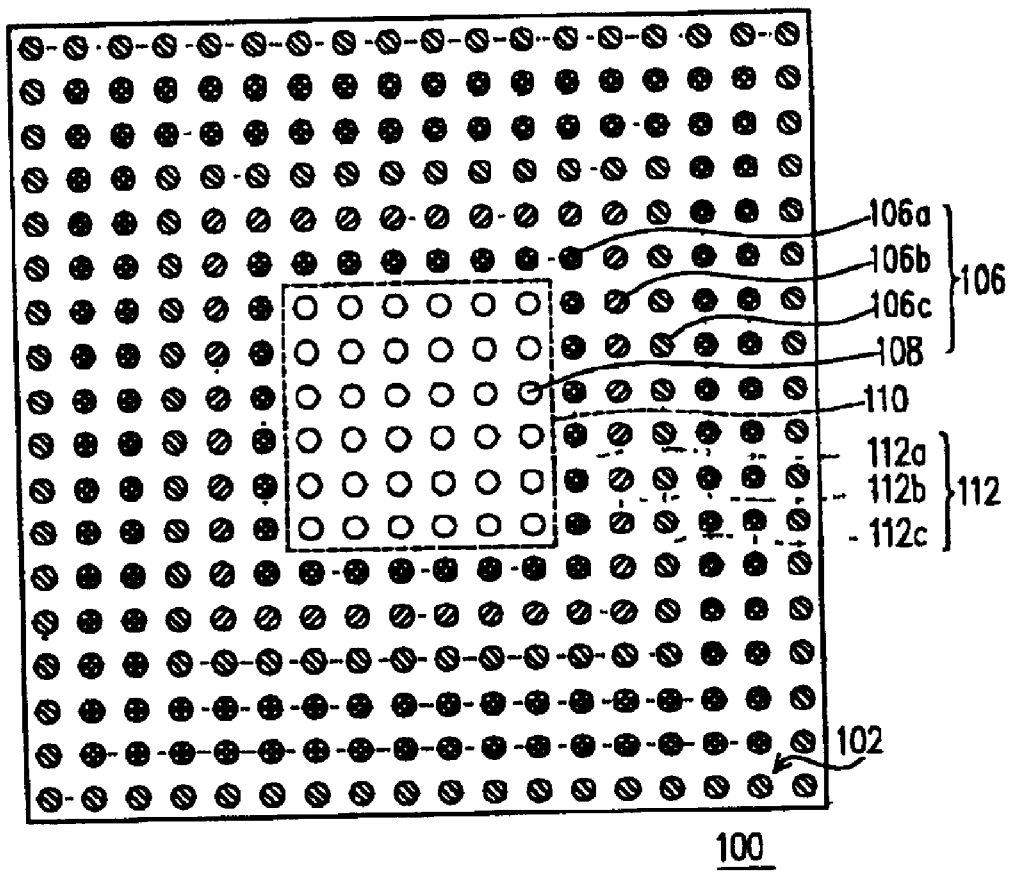
FIG. 2A is a top view of the die shown in FIG. 1.
Figure 2B:
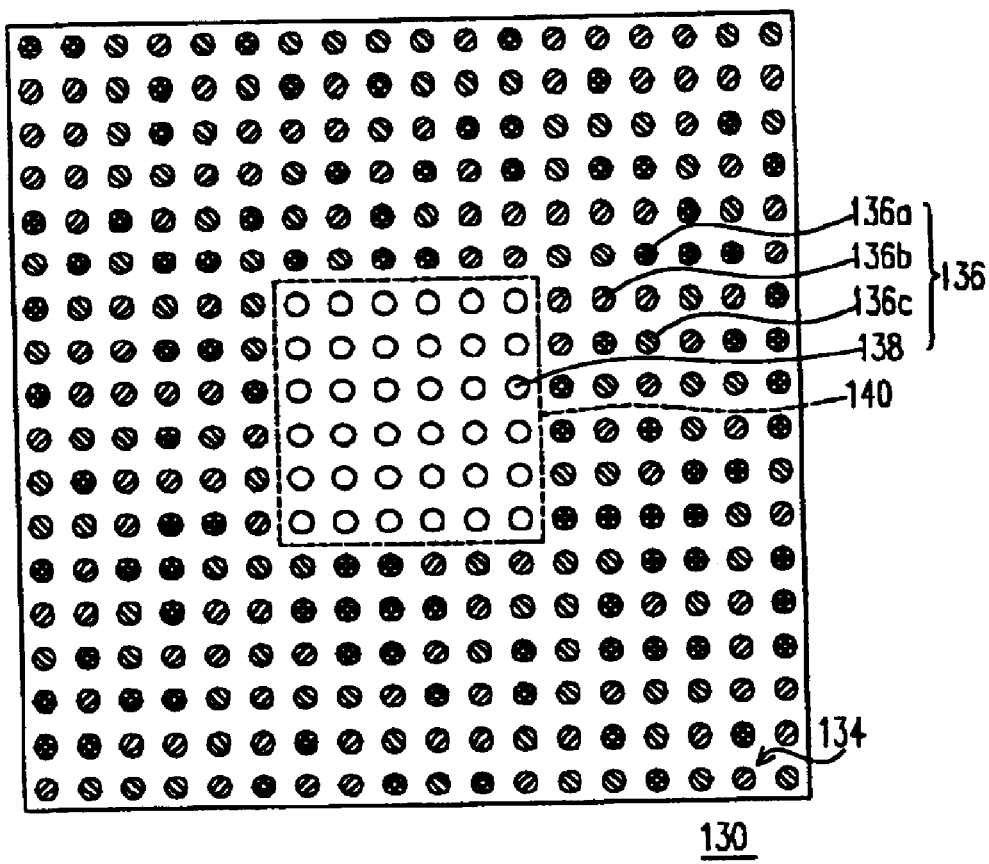
FIG. 2B is a top view of a flip-chip package substrate shown in FIG. 1.

As shown in FIG. 4, the upper surface 202 (the upper surface 22 in FIG. 1) of the flip-chip package substrate 200 has a junction region 220 for bonding with the die in FIG. 2A. The upper surface 202 of the flip-chip package substrate 200 has a plurality of bump pads 206 (the bump pads 34 in FIG. 1) that corresponds to the signal pads 106a, power pads 106b, ground pads 106c and core pads 108 (the die 100 in FIG. 2A). Accordingly, the signal bump pads 206 are divided into signal bump pads 206a, power bump pads 206b, ground bump pads 206c and core bump pads 208. The signal bump pads 206a, the power bump pads 206b and ground bump pads 206c surround the core bump pads 208 to form one or more signal bump pad rings 212a, one or more power bump pad rings 212b and one or more ground bump pad rings 212c. The signal bump pad rings 212a, the power bump pad rings 212b, the ground bump pad rings 212c form concentric rings on the upper surface 202 of the substrate 200 around the central core bump pads 208.

Figure 3A:
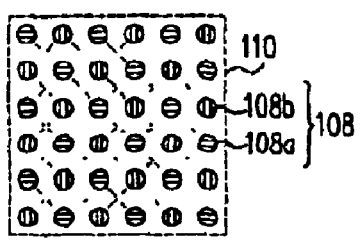
FIG. 3A is a top view of the central portion of the die in FIG. 1 showing a distribution of core power pads and core ground pads.
Figure 3B:
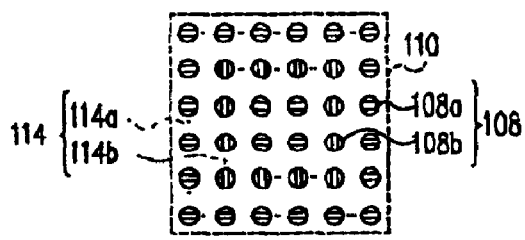
FIG. 3B is a top view of the central portion of the die in FIG. 1 showing an alternative distribution of core power pads and core ground pads.
Figure 5A:
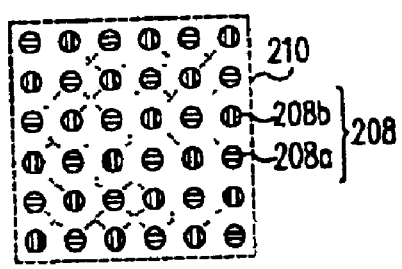
FIG. 5A is a top view of the central portion of the substrate in FIG. 4 showing an alternative distribution of core power bump pads and core ground bump pads.
Figure 5B:
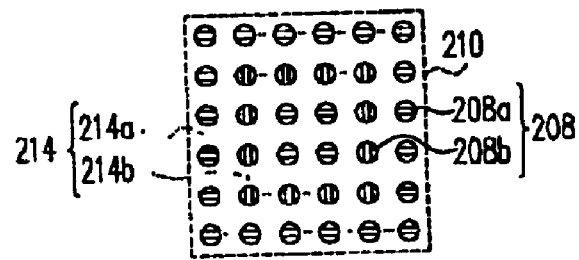
FIG. 5B is a top view of the central portion of the substrate in FIG. 4 showing a ring distribution of core power bump pads and core ground bump pads.

FIGS. 5A and 5B are top views of the central portion of the substrate in FIG. 4 showing two types of distribution of core power bump pads and core ground bump pads. Since the core pads 108 of the die 100 in FIG. 2A may be divided into core power pads 108a and core ground pads 108b as in FIGS. 3A and 3B, the core bump pads 208 in FIG. 4 are also divided into core power bump pads 208a and core ground bump pads 208b. To correspond to the layout of core power pads 108a and core ground pads 108b in FIG. 3A, the core power bump pads 208a and the core ground bump pads 208b are also alternately positioned to form an array inside the core region 210 as shown in FIG. 5A. Similarly, to correspond to the layout of core power pads 108a and core ground pads 108b in FIG. 3B, the core power bump pads 208a and the core ground bump pads 208b are gathered to form one or more core power bump rings 214a and one or more core ground bump rings 214b distributed concentrically around the core region 210.

Figure 6:
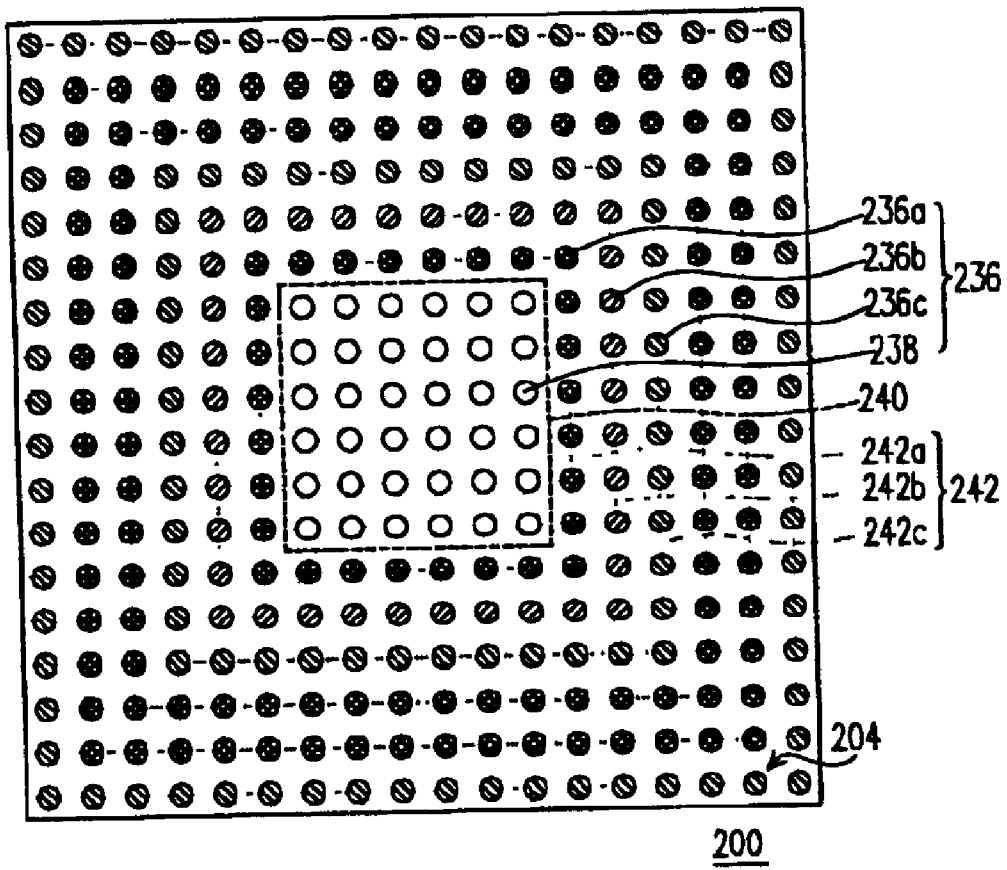
FIG. 6 is a bottom view of the flip-chip package substrate shown in FIG. 4.

FIG. 6 is a bottom view of the flip-chip package substrate shown in FIG. 4. The bottom surface 204 of the flip-chip package substrate 200 has a plurality of ball pads 36. The ball pads 36 are attached to the bottommost wiring layer 26 (the wiring layer closest to the bottom surface 241) as shown in FIG. 1. The ball pads 36 match the signal bump pads 206a, the power bump pads 206b, the ground bump pads 206c and the core bump pads 208 on the upper surface 202 of the substrate 200. Hence, the ball pads 36 may be divided into signal ball pads 236a, power ball pads 236b, ground ball pads 236c and core ball pads 238. The core ball pads 238 are formed inside the core region 240. The signal ball pads 236a, the power ball pads 236b and the ground ball pads 236c are gathered to form one or more signal ball pad rings 242a, power ball pad rings 242b and ground ball pad rings 242c. Furthermore, the signal ball pad rings 242a, the power ball pad rings 242b and the ground ball pad rings 242c distributes concentrically around the core pads 238 on the bottom surface 204 of the flip-chip package substrate 200.

To shorten the wiring distance between the bump pads and the ball pads and to reduce plane inductance and synchronous switching noise, refer to FIGS. 4 and 6. As shown in FIGS. 4 and 6, the ordering of the signal ball pad rings 242a, the power ball pad rings 242b and the ground ball pad rings 242c on the bottom surface 204 of the substrate 200 is identical to the ordering of the signal bump pad rings 212a, the power bump pad rings 212b and the ground bump pad rings 212c on the upper surface 202 of the substrate 200. For example, if the signal bump pad ring 212a is the outermost ring, the signal ball pad ring 242a also occupies the outermost region. With this arrangement, signal bump pads 206a within the outermost ring are wired down to the signal ball pads 236a within the outmost region. Similarly, if the signal bump pad ring 212a is the innermost ring, the signal ball pad ring 242a also occupies the innermost region. With this arrangement, signal bump pads 206a within the innermost ring are wired down to the signal ball pads 236a within the innermost region. Since a bump pad 206 inside an outer ring are wired down to a corresponding ball pads 236 inside an outer ring while a bump pad 206 inside an inner ring are wired down to a corresponding ball pads 236 inside an inner ring, overall wiring length between the bump pads 106 and the ball pads 236 is greatly reduced. Ultimately, plane inductance and synchronous switching noise are reduced and electrical performance of the package is improved.

Figure 7A:
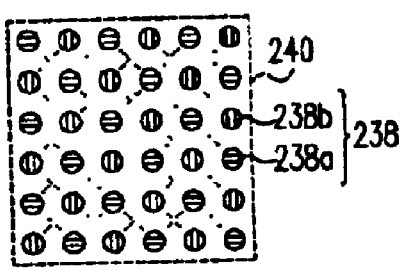
FIG. 7A is a top view of the central portion of the substrate in FIG. 6 showing an alternative distribution of core power ball pads and core ground ball pads.
Figure 7B:
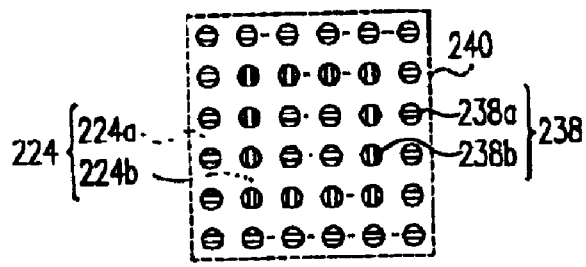
FIG. 7B is a top view of the central portion of the substrate in FIG. 6 showing a ring distribution of core power ball pads and core ground ball pads.

FIGS. 7A and 7B are top views of the central portion of the substrate in FIG. 6 showing two types of distribution of core power ball pads and core ground ball pads. Since the core ball pads 238 in FIG. 6 correspond to the core power bump pads 208a and core ground bump pads 208b in FIGS. 5A and 5B, the core ball pads 238 can be divided into core power ball pads 238a and core ground ball pads 238b. To correspond to the layout of core power bump pads 208a and core ground bump pads 208b in FIG. 5A, the core power ball pads 238a and the core ground ball pads 238b are also alternately positioned to form an array inside the core region 240 as shown in FIG. 7A. Similarly, to correspond to the layout of core power bump pads 208a and core ground bump pads 208b in FIG. 5B, the core power ball pads 238a and the core ground ball pads 238b are gathered to form one or more core power ball rings 244a and one or more core ground ball rings 244b distributed concentrically around the core region 240.

Figure 8:
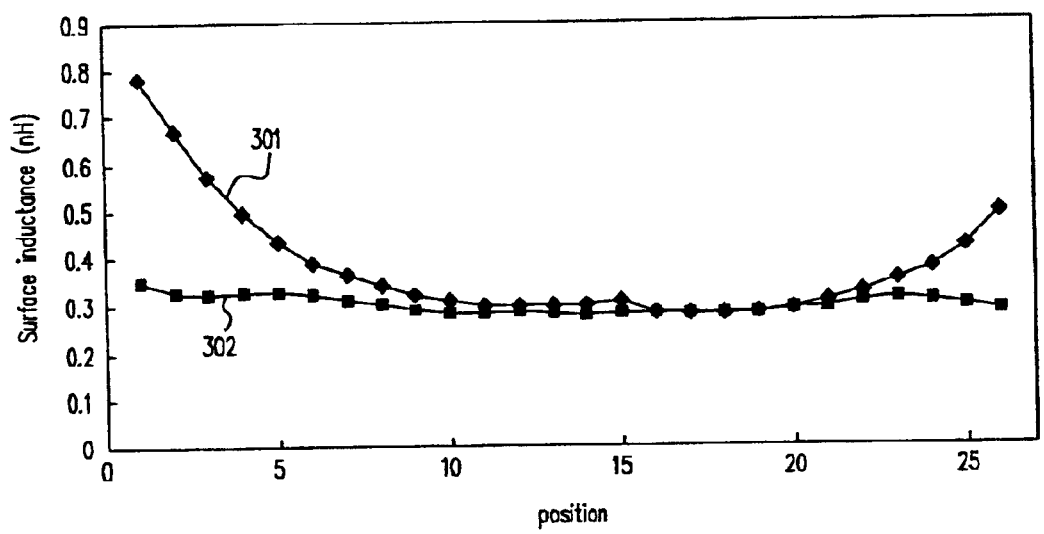
FIG. 8 is a graph for plane inductance versus position between a flip-chip package substrate fabricated according to this invention and a prior art.

FIG. 8 is a graph for comparing plane inductance relative to position between a flip-chip package substrate fabricated according to this invention and a conventional flip-chip package substrate. In general, the schematic layout of bumps on a conventional flip-chip die is unrelated to the layout of ball pads on the substrate and internal wiring inside the substrate. Uncoordinated scheduling between the bump pads and corresponding ball pads often leads to an overall increase in wiring lengths. When an inductance measurement is taken for a block of randomly distributed bonding pads in the flip-chip package substrate, the measured inductance as indicated in curve 301 is considerably inflated near the ends. The reason is that both ends of the block contain ball pads belonging to a different category. Consequently, electrical performance of the flip-chip package severely compromised. In this invention, however, the distribution of the ball pads matches the bump pads within the bump pad rings so that overall length of wires between the bump pads and the ball pads are optimized. Since similar types of ball pads are grouped together and arranged in order, measure inductance within a block as indicated by the curve 302 has a lower overall inductance value especially near the ends. Ultimately, electrical performance of the die inside the flip-chip package is improved.

In summary, major advantages of the flip-chip package substrate includes:

1. The flip-chip package substrate is specially designed such that the power and ground ball pads are gathered together in one place. Hence, printed circuit board layout of the flip-chip package substrate and the carrier are facilitated.

2. The flip-chip package substrate is designed such that bumps on a flip-chip die are wired to the ball pads on the substrate via the shortest wiring route. Hence, plane inductance is reduced and synchronous switching noise is damped down.

3. The flip-chip package substrate concentrates the power and ground ball pads in one place so that a surface layout having thicker lines is possible. Hence, wiring resistance is reduced and better electrical performance is obtained.

4. The flip-chip package substrate permits the same group of signals from the die to travel close to each other and connect to the required power or ground more uniformly.

The flip-chip package substrate fabricated according to this invention matches the conventional die having a multi-ring pad design. The upper surface of the substrate has a multiple of bump pad rings that corresponds to the die. Similarly, the bottom surface of the substrate has a multiple of ball pad rings that corresponds to the bump pad rings. In addition, relative positioning of the bump pad rings belonging to the same functional category also corresponds to the relative positioning of the ball pad rings. Note that each bump pad ring for a particular functional category contains more than 50% bump pads belonging to one bump pad type. Similarly, each ball pad rings for a particular functional category contains more than 50% ball pads belonging to one ball pad type.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A flip-chip package substrate, comprising:
  a plurality of sequentially stacked wiring layers;
  at least one insulation layers between two neighboring wiring layers so that the insulation layer and the wiring layer are alternately stacked on top of each other; and
  at least one conductive plugs passing through the insulation layer for electrically connecting the wiring layers;
  wherein the uppermost wiring layer further includes:
    a plurality of core bump pads;
    at least two signal bump pad rings around the core bump pads;
    at least one power bump pad rings around the core bump pads; and
    at least one ground bump pad ring around the core bump pads, wherein one of said power bump pad ring and one of said ground bump pad ring are positioned between said two signal bump pad rings;
  wherein the signal bump pad rings, the power bump pad rings and the ground bump pad rings are distributed concentrically; and
  the bottommost wiring layer further includes:

a plurality of core ball pads;

at least one signal ball pad rings around the core ball pads;

at least one power ball pad rings around the core ball pads; and at least one ground ball pad rings around the core ball pads;

wherein the signal ball pad rings, the power ball pad rings and the ground ball pad rings are distributed concentrically.

2. The flip-chip package substrate of claim 1, wherein the core bump pads includes a plurality of core power bump pads and a plurality of core ground bump pads.

3. The flip-chip package substrate of claim 2, wherein the core power bump pads and the core ground bump pads are alternately positioned.

4. The flip-chip package substrate of claim 2, wherein the core power bump pads are grouped together to form at least one core power bump pad ring, the core ground bump pads are grouped together to form at least one core ground bump pad ring and both the core power bump pad ring, and the core ground bump pad rings are distributed concentrically.

5. The flip-chip package substrate of claim 1, wherein the core ball pads includes a plurality of core power ball pads and a plurality of core ground ball pads.

6. The flip-chip package substrate of claim 5, wherein the core power ball pads and the core ground ball pads are alternately positioned.

7. The flip-chip package substrate of claim 5, wherein the core power ball pads are grouped together to form at least one core power ball pad ring, the core ground ball pads are grouped together to form at least one core ground ball pad ring and both the core power ball pad rings, and the core ground ball pad rings are distributed concentrically.

8. The flip-chip package substrate of claim 1, wherein the signal bump pad rings encloses a plurality of bump pads over 50% of which are signal bump pads.

9. The flip-chip package substrate of claim 1, wherein the power bump pad ring encloses a plurality of bump pads over 50% of which are power bump pads.

10. The flip-chip package substrate of claim 1, wherein the ground bump pad ring encloses a plurality of bump pads over 50% of which are ground bump pads.

11. The flip-chip package substrate of claim 1, wherein the signal ball pad rings encloses a plurality of ball pads over 50% of which are signal ball pads.

12. The flip-chip package substrate of claim 1, wherein the power ball pad ring encloses a plurality of ball pads over 50% of which are power ball pads.

13. The flip-chip package substrate of claim 1, wherein the ground ball pad ring encloses a plurality of ball pads over 50% of which are ground ball pads.

* * * * *